US009251845B2

(12) United States Patent
Krachkovsky et al.

(10) Patent No.: US 9,251,845 B2
(45) Date of Patent: Feb. 2, 2016

(54) MULTI-LEVEL ENUMERATIVE ENCODER AND DECODER

(71) Applicant: LSI Corporation, San Jose, CA (US)

(72) Inventors: Victor Krachkovsky, Allentown, PA (US); Razmik Karabed, San Jose, CA (US); Shaohua Yang, San Jose, CA (US); Wu Chang, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/318,665

(22) Filed: Jun. 29, 2014

(65) Prior Publication Data

US 2015/0380050 A1 Dec. 31, 2015

(51) Int. Cl.
*G11B 5/02* (2006.01)
*G11B 20/12* (2006.01)

(52) U.S. Cl.
CPC .................................. *G11B 20/1217* (2013.01)

(58) Field of Classification Search
CPC ............... G11B 20/10009; G11B 5/09; G11B 20/1403; G11B 27/3027; G11B 2220/30; G11B 5/59655
USPC ....................... 360/29, 40, 51, 52, 53, 48, 55; 369/59.23; 375/341; 341/58
See application file for complete search history.

(56) References Cited

U.S. PATENT DOCUMENTS

| | | | | |
|---|---|---|---|---|
| 7,616,134 | B1 * | 11/2009 | Mittelholzer | 341/58 |
| 8,578,246 | B2 * | 11/2013 | Mittelholzer et al. | 714/773 |
| 8,625,221 | B2 * | 1/2014 | Feng et al. | 360/51 |
| 2003/0227397 | A1 * | 12/2003 | Cideciyan et al. | 341/58 |

* cited by examiner

*Primary Examiner* — Nabil Hindi

(57) ABSTRACT

A storage system includes a storage medium operable to maintain a data set, a read/write head assembly operable to write the data set to the storage medium and to read the data set from the storage medium, a multi-level enumerative encoder operable to encode the data set before it is written to the storage medium as encoded data, wherein the enumerative encoder applies an enumeration using a plurality of level-dependent bases, and a decoder operable to decode the data set after it is read from the storage medium.

20 Claims, 5 Drawing Sheets

MULTI-LEVEL ENUMERATIVE ENCODER AND DECODER

FIELD OF THE INVENTION

Various embodiments of the present invention provide systems and methods for enumerative encoding and decoding.

BACKGROUND

Various products including hard disk drives and transmission systems utilize a read channel device to encode data, store or transmit the encoded data on a medium, retrieve the encoded data from the medium and decode and convert the information to a digital data format. Such read channel devices may include data processing circuits including encoder and decoder circuits or endecs to encode and decode data as it is stored and retrieved from a medium or transmitted through a data channel, in order to reduce the likelihood of errors in the retrieved data. It is important that the read channel devices be able to rapidly and accurately decode the original stored data patterns in retrieved or received data samples.

The encoded data can be constrained to follow one or more rules that reduce the chance of errors. For example, when storing data on a hard disk drive, it can be beneficial to avoid long runs of consecutive transitions, or long runs of 0's or 1's.

BRIEF SUMMARY

Various embodiments of the present invention provide systems, apparatuses and methods for multi-level enumerative encoding and decoding for constrained systems. In some embodiments, a storage system includes a storage medium operable to maintain a data set, a read/write head assembly operable to write the data set to the storage medium and to read the data set from the storage medium, a multi-level enumerative encoder operable to encode the data set before it is written to the storage medium as encoded data, wherein the enumerative encoder applies an enumeration using a plurality of level-dependent bases, and a decoder operable to decode the data set after it is read from the storage medium.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Embodiments of the present invention are related to modulation coding or source coding using multi-level enumeration. The encoded bits are statistically near-equivalent to a Markov source, such as, but not limited to, the Markov source that provides near-optimal magnetic channel performance. Some embodiments include enumeration on costly transition-run graphs and periodic bases/threshold presentations where the costs assigned to the edges of any such graph are computed from a given Markov chain. The enumerative coding is performed with reduced bit presentations in some embodiments, with multi-level periodic bases or thresholds. Some embodiments use a reduced-bits mantissa presentation for bases or thresholds. Some embodiments include decoder termination rules enabling the codeword to have any arbitrary length. Some embodiments include latency cancellation, using a first sync pattern replacement allowing the encoding and decoding to be performed in the same direction such as, but not limited to, from most significant bit (MSB) to least significant bit (LSB). By replacing encoded data sequences that would otherwise cause carry-overs with a first sync pattern, (e.g., a sequence 100 . . . 0 with a length that would cause a carryover in the decoder state), the multi-level enumerative encoder can use a finite length accumulator regardless of encoder data size, and can decode the encoded data in the same bit significance direction as the encoder, eliminating the latency of storing the encoded data before beginning the decoding process. Some embodiments include k-constraint support using sync pattern replacement, limiting the length of runs of 0 bits in the encoded sequence to k successive 0's by replacing longer runs of 0 bits with a second sync pattern.

Figure 1:
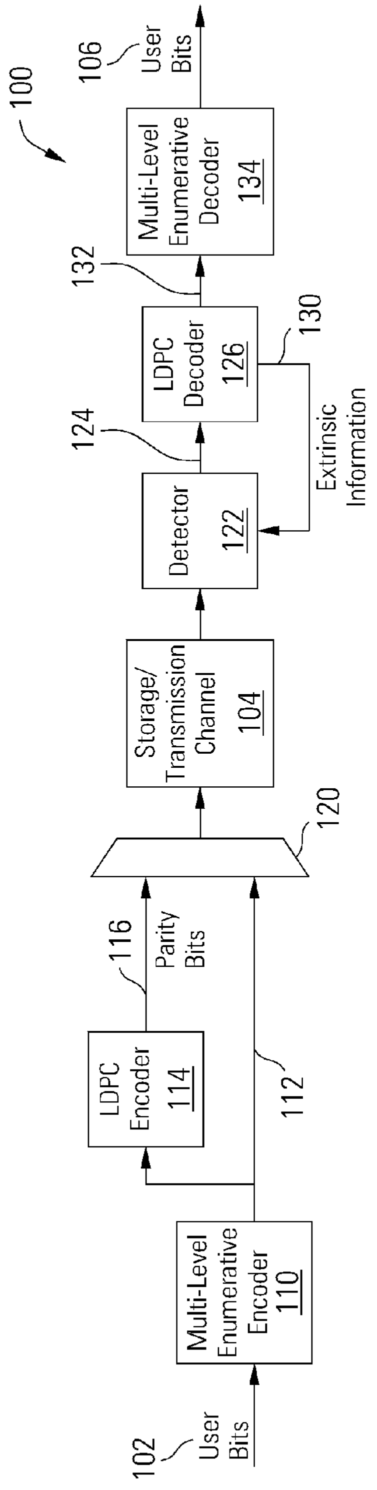
FIG. 1 depicts a block diagram of a read channel including a multi-level enumerative encoder and decoder which can be used to store and retrieve or transmit and receive data in accordance with some embodiments of the present invention.

Although the multi-level enumerative encoder and decoder disclosed herein are not limited to any particular application, they can be used for example in a read channel of a storage device. Turning to FIG. 1, a read channel 100 is used to process user data bits 102, store them in or transit them through a storage or transmission channel 104 and retrieve the user data bits 106 without introducing errors. The user data bits 102 are processed in a multi-level enumerative encoder 110 which performs modulation encoding or source encoding of user data bits 102, matching or near-matching the Markov source characteristics of the channel 104. In some embodiments, the multi-level enumerative encoder 110 applies hard constraints such as, but not limited to, maximum transition-run (MTR) and (d,k) constraints. For example, the frequency response of the read channel 100 is generally at a maximum at DC and degrades near the Nyquist frequency, particularly when the storage or transmission channel 104 is a magnetic storage device. By limiting the maximum transition run length in the encoded user bits 112, the read channel 100 operates below the Nyquist frequency and avoids errors that might be introduced by the degraded frequency response near the Nyquist frequency. The multi-level enumerative encoder 110 can also perform latency cancellation, replacing patterns in the encoded user bits 112 that would lead to carry-overs when decoding the encoded user bits 112, supporting encoding and decoding in the same direction, such as, but not limited to, from most significant bit (MSB) to least significant bit (LSB). In addition, the multi-level enumerative encoder 110 can also replace long zero run patterns in the encoded bits that would cause degraded behavior of control loops at the decoder side.

The encoded user bits 112 are provided to a low density parity check (LDPC) encoder 114, which produces parity bits 116 for the encoded user bits 112. The parity bits 116 are combined with the encoded user bits 112 in a multiplexer 120, and the resulting data is stored in or transmitted through storage or transmission channel 104.

The data retrieved or received from the storage or transmission channel 104 and is processed in a detector 122. Additional components may be included as is known before and after the storage or transmission channel 104. For example, if the storage or transmission channel 104 is a magnetic hard disk drive, an analog front end can be included to amplify and filter an analog signal from the magnetic hard disk drive, followed by an analog to digital converter to sample the analog signal and provide a digital bit stream. Filtering components can also be included, such as a digital finite impulse response filter, to filter the signal to the detector 122.

The detector 122 can be any detector circuit known in the art including, but not limited to, a Viterbi algorithm detector circuit or a maximum a posteriori detector circuit. Based upon the disclosure provided herein, one of ordinary skill in the art will recognize a variety of detector circuits that may be used in relation to different embodiments of the present invention. Detector circuit 122 performs a data detection process on the received input from the storage or transmission channel 104 resulting in a detected output 124. The detected output 124 is provided to a decoder such as an low density parity check decoder 126 which performs parity checks on the detected output 124, ensuring that parity constraints established by the low density parity check encoder 114 are satisfied in order to detect and correct any errors that may have occurred in the data while passing through the storage or transmission channel 104 or other components of the read channel 100. Other error detection and correction encoders and decoders may be used in the read channel 100 in place of the low density parity check encoder 114 and low density parity check decoder 126, and one of ordinary skill in the art will recognize a variety of error detection and correction encoders and decoders that may be used in relation to different embodiments of the present invention. In the case of the low density parity check encoder 114 and low density parity check decoder 126, the detector 122 and low density parity check decoder 126 can operate in an iterative fashion, with extrinsic information 130 passed from the low density parity check decoder 126 to the detector 122 to aid in the data detection and parity check process. The low density parity check decoder 126 yields encoded user bits 132 retrieved from the storage or transmission channel 104, with the parity bits removed after the combination of encoded user bits and parity bits satisfy the parity check constraints.

The encoded user bits 132 from the low density parity check decoder 126 are provided to a multi-level enumerative decoder 134 which reverses the enumerative encoding performed by the multi-level enumerative encoder 110. The multi-level enumerative decoder 134 yields user data bits 106, which should be identical to user data bits 102 if the data is not corrupted in the storage or transmission channel 104 beyond the capacity of the detector 122 and low density parity check decoder 126 to correct.

In some embodiments, the multi-level enumerative encoding and decoding is applied to channels with inter-symbol interference (ISI). The channel capacity can generally be reached by a general concatenation of an error-correcting code with a source code, for which Markov sources provide tight capacity bound under the additive Gaussian noise condition. The same is true for magnetic recording (MR) channels, which represent a class of inter-symbol interference channels with nonlinear noise components such as transition jitter and pulse variations. In some embodiments, the source code applied by the multi-level enumerative encoding is a matching modulation code, or a shaping code, for the Markov model describing the data source.

The multi-level enumerative encoding and decoding is applied in some embodiments to channels with cost constraints, also referred to herein as costly channels. The definition of a costly channel is general and can include "hard" constraints, such as maximum transition-run (MTR) and (d, k)-constraints used in magnetic and optical recording. Such constraints can be incorporated into the costly channels by using infinite costs for prohibited bit patterns.

The multi-level encoding involves multi-level enumeration of Markov sources. Enumeration yields a binary output sequence Y given an input integer X, using bases $B_n$ (or thresholds), where $B_n=2^n$ for binary enumeration, or $B_n=B_{n-1}+B_{n-2}$ for Fibonacci enumeration. The binary coefficients $y_0, y_1, \ldots$ for output sequence Y are calculated with single-level enumeration as $X=\Sigma_{i=0}^{N-1} y_i \cdot B_{N-1-i}$. In contrast, multi-level enumeration with floating point bases and periodic mantissas can be expressed as follows:

$$X \cdot 2^S + z' = \Sigma_{i=0}^{N-1} y_i \cdot B_{(n_{ini}-i) \bmod P}(l_i) \cdot 2^{e_{N-1-i}+g(l_i)} + 2^S - 1 \quad \text{(Eq 1)}$$

where X is the input integer to be encoded and $y_i$ is the output sequence. The input integer X is scaled to the mantissa size by scaling factor $2^S$, where S is the maximal bit size for all the bases. The target encoded length is N. The enumeration level $l_i$ changes with each step i. The level-dependent bases are floating point values and thus can be represented by mantissas $B_{(n_{ini}-1) \bmod P}(l_i)$ and an exponent $2^{e_{N-1-i}+g(l_i)}$. Because the mantissa has a limited number of bits in binary representation, the exponent $e_{N-1-i}$ decreases with i. In order to reduce the mantissa size, the exponent includes a level-dependent adjustment value $g(l_i)$, which is greater than or equal to 0 and which is defined as the number of least significant bits in the l-row entries of the base lookup table that are truncated to zero during the weight computation. The mantissa is periodic in some embodiments with period P, so the indexing of the mantissa is performed over mod P. In other words, when the mantissa index is decremented down to −1, it is set to P−1. In this way, the mantissa does not need to be stored as an infinite sequence, rather, can be stored over period P. Again, the bases are level-dependent, and in some embodiments, the mantissa values are stored in a lookup table indexed in one dimension (e.g., columns) from 0 to P−1 and in another dimension (e.g., rows) across the enumeration levels $l_i$ of Equation 1.

Because the mantissa is periodic, when the enumeration is terminated there can be a residual term or remainder z'. In some embodiments, the remainder z' is less than $2^S$ and is discarded in the encoder, and a correction factor $2^S-1$ is added enabling reconstruction of the remainder during decoding.

In some embodiments, the enumeration level l is calculated using a cost balance equation:

$$l \leftarrow \max(l+d_t-c_n, 0) \qquad \text{(Eq 2)}$$

where $d_t$ is the cost of an encoded bit, t is the transition count, $c_n$ is a cost decrement. At each step i in Equation 1, the new enumeration level l is obtained based on the previous level plus the cost $d_t$ of the encoded bit, minus cost decrement $c_n$, truncated or limited to a minimum level 0. The cost $d_t$ of the encoded bit is a function of the transition count t, and is based on the channel properties. For example, in some embodiments, the cost increases as the number of successive transitions increases, meaning that it becomes increasingly more difficult for the channel to pass the successive transitions and the cost $d_t$ is used to progressively punish transitions in the encoded output. The cost decrements $c_n$ form a fixed, periodic sequence that implements a cost balance.

The multi-level enumerative encoding is performed as follows in some embodiments. In the following description, the vector of user bits is: $x=(x_0, x_1 \ldots, x_{K-1})$, $X=x_0 \cdot 2^{K-1}+x_1 \cdot 2^{K-2}, \ldots, x_{K-1} \cdot 1$. The encoder is initialized with parameters: $i_y=0$, $i_x=s_{ini}$, $t=0$, $l=l_{ini}$, $n=n_{ini}$, where t is the run-length counter, K is the sector length or length of other data block to be encoded, l is the current level, $l_{ini}$, $n_{ini}$ are fixed, and $i_x$ is the input bit counter. The encoder state is initialized from $s_{ini} \leq s$ input bits as: $S_{enc}=x_0 \cdot 2^{s_{ini}-1}+x_2 \cdot 2^{s_{ini}-2}+ \ldots +x_{s_{ini}} \cdot 1$. Then, the encoded word $y=(y_0, y_1, \ldots, y_{N-1})$ is recursively computed for $i_y=0, \ldots, N-1$:

$$y_{i_y} = \begin{cases} 1 \text{ if } S_{enc} \geq B_n(l) \\ 0 \text{ otherwise} \end{cases} \qquad \text{(Eq 3)}$$

$$S_{enc} \leftarrow S_{enc} - y_{i_y} \cdot B_n(l)$$

$$l \leftarrow \max(l + d_t - c_n, 0)$$

$$t \leftarrow \begin{cases} t+1, \text{ if } y_{i_y} = 1 \\ 0, \text{ otherwise} \end{cases}$$

$$\text{if } \delta_n == 0$$

$$\quad S_{enc} \leftarrow 2 \cdot S_{enc} + x_{i_x}$$

$$\quad i_x \leftarrow i_x + 1$$

$$n \leftarrow n - 1 \bmod N_p$$

The level updating in the multi-level enumerative encoder thus includes setting the output bit $y_{i_y}$ to 1 if the encoder state $S_{enc}$, which is updated based on the incoming information bits $x_{i_x}$, is greater than the base or threshold $B_n(l)$ for the current level l, and is set to 0 otherwise. The encoder state $S_{enc}$ is then updated by subtracting the base $B_n(l)$ from the encoder state $S_{enc}$ when the output bit $y_{i_y}$ is 1. The level l is updated according to Equation 2. The transition count t is incremented whenever the output bit $y_{i_y}$ is 1, and is reset to 0 when the output bit $y_{i_y}$ is 0.

The encoder state $S_{enc}$ is shifted based on the incoming bit $x_{i_x}$ only when the incoming bit $x_{i_x}$ is an information bit, not a modulation or parity bit. In other words, a new encoded bit is added only when the incoming bit is an information bit, because modulation bits would be redundant in the encoded data. In some embodiments, a modulation flag $\delta_n$ is used as a convenience instead of the exponents to identify whether the incoming bit $x_{i_x}$ is an information bit. Modulation flag $\delta_n$ is defined as $\delta_n=1-e_n+e_{n-1} \in \{0,1\}$. Thus, $e_n=e_{n-1}+1$, if $\delta_n=0$, and $e_n=e_{n-1}$, otherwise, and $$e_0 = 0,\ e_n = n - \sum_{j=0}^{n} \delta_j \text{ for } n = 1, \ldots, N-1.$$

The incoming bit index $i_x$ is also incremented only when the incoming bit $x_{i_x}$ is an information bit. The mantissa index n is decremented, resetting to the mantissa period $N_p-1$ when the decremented index n would be below 0, using a modulo operation.

Where the sector length K is less than the typical size of the data to be encoded, such as in a system with variable length sectors, where $i_x \geq K$ the encoder is fed with dummy bits $x_{i_x}=0$.

The corresponding multi-level enumerative decoder reverses the encoding to reconstruct X by summing up the terms on the right side of Equation 1. To reduce the encoder-decoder loop latency, the decoding can be performed in the same direction as the encoding, such as, but not limited to, most significant bit to least significant bit. Thus the decoder memory will be an r-bit register/adder $S_{dec}=(\sigma_{r-1}, \sigma_{r-2}, \ldots, \sigma_0)$ that keeps r least significant bits of the accumulated sum: $\sigma_j=\hat{x}_{i_x-j}$, $0 \leq j<r$, where $\hat{x}_{i_x-j}$ are decoded bit estimates, and $i_x$ is the index of the decoded bit stored in $\sigma_0$. The decoder is initialized: $S_{dec}=0 i_x=s_{ini}$, $i_y=0$, $l=l_{ini}$ $n=n_{ini}$, $t=0$, and then recursively computes:

$$S_{dec} \leftarrow S_{dec} - y_{i_y} \cdot B_n(l) \qquad \text{(Eq 4)}$$

$$l \leftarrow \max(l + d_t - c_n, 0)$$

$$t \leftarrow \begin{cases} t+1, \text{ if } y_{i_y} = 1 \\ 0, \text{ otherwise} \end{cases}$$

$$\text{if } \delta_n == 0$$

$$\quad x_{i_x} = \sigma_{r-1}$$

$$\quad S_{dec} \leftarrow (2 \cdot S_{dec}) \,\&(2^r - 1)$$

$$\quad i_x \leftarrow i_x + 1$$

$$n \leftarrow n - 1 \bmod N_p$$

for $i_y=0, 1, \ldots, N-1$. After the last step, the correction term is added: $S_{dec} \leftarrow S_{dec}+2^s-1$, and then K decoded bits are shifted out of $S_{dec}$. The level updating in the multi-level enumerative decoder thus includes updating the decoder state $S_{dec}$ by adding the base $B_n(l)$ to the decoder state $S_{dec}$ when the output bit $y_{i_y}$ is 1. The level l is updated according to Equation 2, or in some embodiments is retrieved from the first sync pattern embedded in the encoded data. The transition count t is incremented whenever the output bit $y_{i_y}$ is 1, and is reset to 0 when the output bit $y_{i_y}$ is 0. The output bit $x_{i_x}$ is set by the most significant bit $\sigma_{r-1}$ of the accumulated decoder state.

In some embodiments, the multi-level enumerative encoder 110 performs latency cancellation in some embodiments by replacing sequences or segments in the encoded data if the corresponding user data have a 1 followed by a run of 0's with a length that would cause a carryover in the decoder state during decoding. In some embodiments, the multi-level enumerative encoder 110 also applies k constraints to prevent long runs of 0 bits. The first sequences are marked by inserting a first sync pattern, the second sequences are replaced by a second sync pattern. The decoder then replaces the sync patterns in output bits with the original data segments, which comprise user data for the first sync pattern and encoder data for the second sync pattern. Apart from being a position indicator, the first sync pattern also contains the level and the run-length counter values. Both the first and second sync patterns are patterns that never occur in the encoded data in normal conditions.

The sync pattern contents and format is based upon the code and constraints. In some embodiments, the first sync pattern is a 28-bit sequence beginning with a 0, containing a 13-bit string of 1's, a 0, a 7-bit λ field representing the level, a 4-bit t field representing the transition count, and ending with a "10". The 13-bit string of 1's provides the sync property, because the multilevel enumeration code design prohibits to have more than 12 successive 1's in the encoded data. Thus, if a 13-bit sequence of 1's, preceded and followed by 0's, is detected by the decoder in the encoded data, a sync pattern has been found. The second sync pattern is also a 28-bit sequence beginning with a 0, containing a 13-bit string of 1's, a 0, an 11-bit field that can be distinguished from any values of the λ and t fields of the first sync pattern, and ending with a "10". For example, in some embodiments, the 11-bit field in the second sync pattern contains the value 0x61A.

The content of the λ and t fields can be based upon the code and constraints to yield a suitable overall sync pattern. For example, in some embodiments using a high rate code such as, but not limited to, a 200/201 code, 144/145 code, or 96/97 code, the 7-bit λ field contains a 7-bit level information value and the 4-bit t field contains a 4-bit transition count value. In some other embodiments using a low rate code such as, but not limited to, a 17/18 code, the 7-bit λ field contains a 6-bit level information value split into two 3-bit fields separated by a 0, thus satisfying a maximum transition run of 3 (MTR3) constraint, and the 4-bit t field contains a 2-bit transition count value preceded and followed by 0's to satisfy the MTR3 constraint. The 13-bit sync field in the first and second sync patterns for a low rate code with an MTR3 constraint is a "1110111011101", a pattern that is prohibited by the code design.

In some embodiments, an extended MTR3 constraint is applied, limiting the length of successive 3-transition runs, such as, but not limited to, $j_{ext}$=12, or a 12-bit total length of a segment containing successive 3-transition runs. Table 1 below shows a set of extended transition runs, such that they represent an ordered set, and all possible concatenations of such runs result in an MTR3 channel, for which the extended MTR3 run-length satisfied the inequality l(i)≤12. Each run has a maximum of three successive 1's and two successive 0's. None of these runs can be presented as a concatenation of shorter runs. The length of each run is given as l(i). For the run with index i, its cost w(i) is defined as a sum of constituent bit-costs, where the cost of "one" is 1, and the cost of "zero" is 0.

Figure 2:
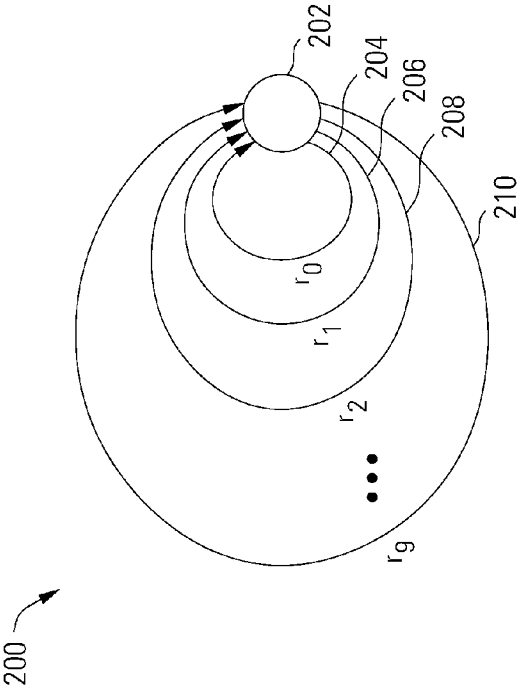
FIG. 2 depicts a finite state transition diagram (FSTD) for an extended maximum transition run (MTR) of three that can be implemented in some embodiments of a multi-level enumerative encoder and decoder in accordance with some embodiments of the present invention.

An equivalent variable length graph 200 is shown in FIG. 2, having one state 202 and thirteen edges (e.g., 204, 206, 208, 210) corresponding with runs r(0) to r(9) of Table 1. The paths on graph 200 generate an MT3 channel with an extended MTR3 constraint equal to 12. Multi-level enumeration performed with graph 200 builds a periodic set of weights or costs w(i) and thresholds.

TABLE 1

| i | run r(i) | l(i) | w(i) | D |
|---|---|---|---|---|
| 0 | 0 | 0 | 0 | 0 |
| 1 | 10 | 1 | 1 | 1 |
| 2 | 110 | 2 | 2 | 1 |
| 3 | 11100 | 4 | 3 | 1 |
| 4 | 111010 | 5 | 4 | 1 |
| 5 | 1110110 | 6 | 5 | 1 |
| 6 | 111011100 | 8 | 6 | 1 |
| 7 | 1110111010 | 9 | 7 | 1 |
| 8 | 11101110110 | 10 | 8 | 1 |
| 9 | 1110111011100 | 12 | 9 | 1 |

Figure 3:
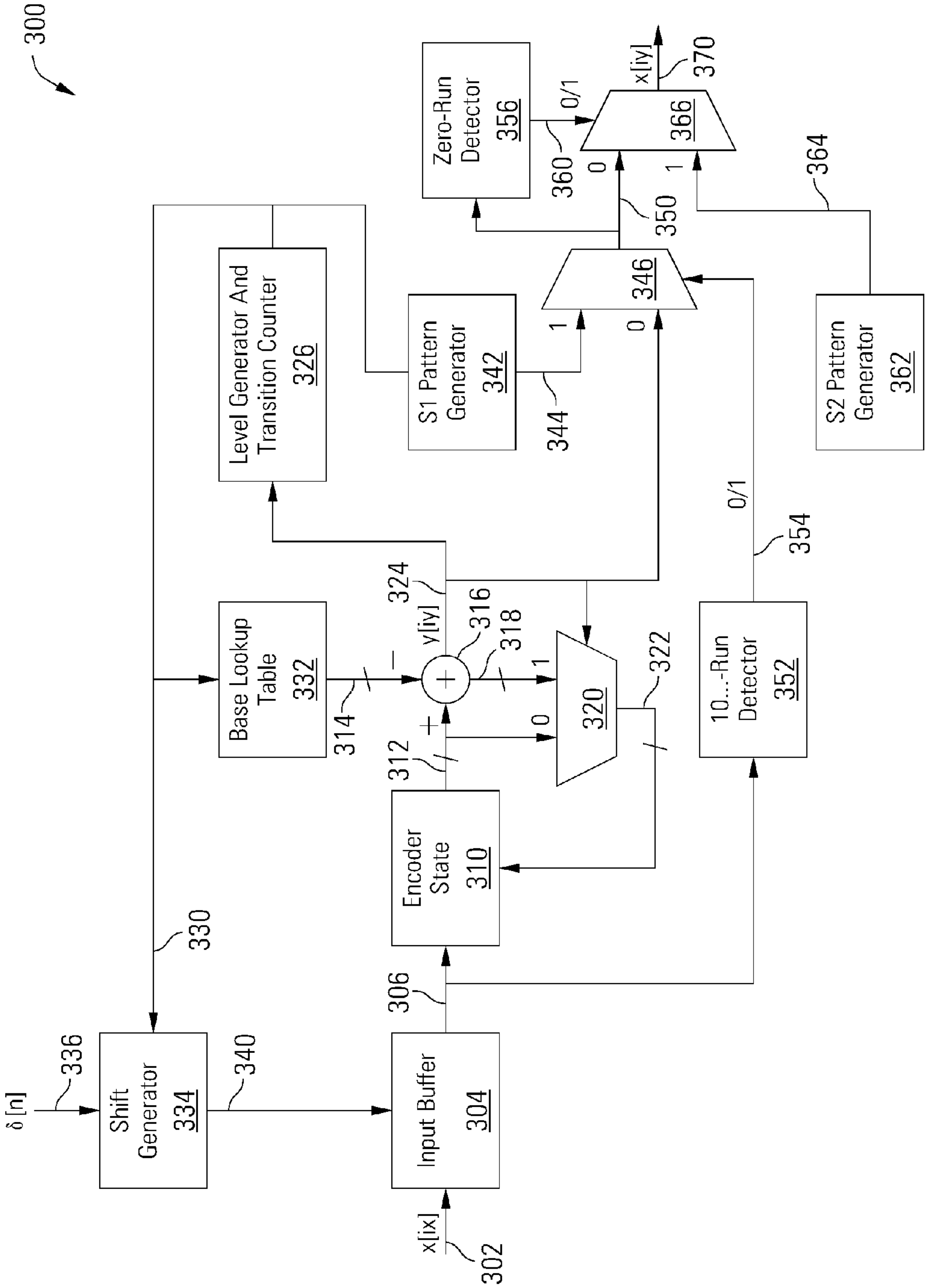
FIG. 3 depicts a block diagram of a multi-level enumerative encoder in accordance with some embodiments of the present invention.

Turning to FIG. 3, a multi-level enumerative encoder 300 is illustrated in accordance with some embodiments of the invention and which may be suitable for use, along with other embodiments, in place of the MTR encoder 110 of FIG. 1. Input bits x[ix] 302 are received in an input buffer 304, and are shifted out of the input buffer 304 in 0, 1 or 2 bit groups to yield bits to encode 306. The number of bits to be shifted out of input buffer 304 at each encoding step is controlled by shift signal 340, based upon the current encoding level and whether the current bits include a modulation bit, according to the exponent adjustment in Equation 1.

An encoder state circuit 310 receives the bits to encode 306 and represents a summator and an MSB-to-LSB shifter. Encoded bits y[iy] 324 are found by comparing the encoder state 312 with thresholds $B_n$(l) 314 in subtraction circuit 316, implemented in some embodiments as a summator. In some embodiments, the encoder state 312 is a 12-bit value and thresholds $B_n$(l) 314 are 11-bit values. The encoder state circuit 310 is updated by subtracting the current threshold $B_n$(l) 314 if the current encoded bit y[iy] is 1. For example, this can be achieved by selecting in multiplexer 320 either the previous encoder state 312 or the previous encoder state minus the threshold 314 as a new 12-bit encoder state value 322, and storing the new encoder state value 322 in encoder state circuit 310. If the result 316 of the encoder state 312 minus the threshold $B_n$(l) 314 is negative, then the current y bit is 0, in which case the multiplexer 320 returns the previous encoder state 312 as the new encoder state 322 to be stored in encoder state circuit 310.

The thresholds $B_n$(l) 314 are retrieved from a base lookup table 332 based on the current level and transition count. A level generator and transition counter circuit 326 updates the level number according to Equation 2 and counts 1's in encoded bits y[iy] 324, yielding the level and transition count 330. (Notably, 1's in encoded bits y[iy] 324 correspond with magnetic channel transitions in NRZI, or non-return to zero inverted, notation.) A shift generator 334 calculates the value of the shift signal 340, based upon the current and the next encoding level and whether the current bits include a modulation bit, as indicated by modulation flag $\delta_n$ 336, according to the exponent adjustment in Equation 1.

In some embodiments, the multi-level enumerative encoder 300 includes a latency cancellation circuit, including a 10 . . . -run detector circuit 352, first sync pattern generator circuit 342 and selection switch or multiplexer 346. The 10 . . . -run pattern detector circuit 352 receives input bits to be encoded 306 and detects prohibited run patterns with a "1000 . . . " bit pattern or follow-up zero-runs of a particular length, such as, but not limited to, 48 bits. The 10 . . . -run detector circuit 352 yields an indicator signal 354 that indicates whether the pattern was detected, in some embodiments asserting the indicator signal 354 high when the prohibited run pattern is detected in the input bits to be encoded 306. The first sync pattern generator circuit 342 generates a first sync pattern 344 as disclosed above based on the level and transition count. The multiplexer 346 outputs the encoded bits y[iy] 350, containing the encoded bits y[iy] 324 with the locations of prohibited runs marked by the first sync pattern. (Although prohibited runs are in the user bits, the replacement by the first sync pattern takes place in the encoded bits.)

In some embodiments, the multi-level enumerative encoder 300 includes a K-constraint circuit, including a zero-run detector circuit 356, second sync pattern generator circuit 362 and selection switch or multiplexer 366. The zero-run detector circuit 356 detects zero-runs of a particular length in the encoded bits y[iy] 350, such as, but not limited to 28-bit zero runs that are not a part of first sync pattern replacements marking prohibited run patterns detected by the 10 . . . -run pattern detector circuit 352. The zero-run detector circuit 356 yields an indicator signal 360 that indicates whether the prohibited 0-run pattern was detected, in some embodiments asserting the indicator signal 360 high when the prohibited run pattern is detected in the encoded bits y[iy] 350. The second sync pattern generator circuit 362 generates a fixed second sync pattern 364 as disclosed above. The multiplexer 366 outputs the encoded bits y[iy] 370, containing the encoded bits y[iy] 350 with the prohibited 0-runs replaced by the second sync pattern.

Figure 4:
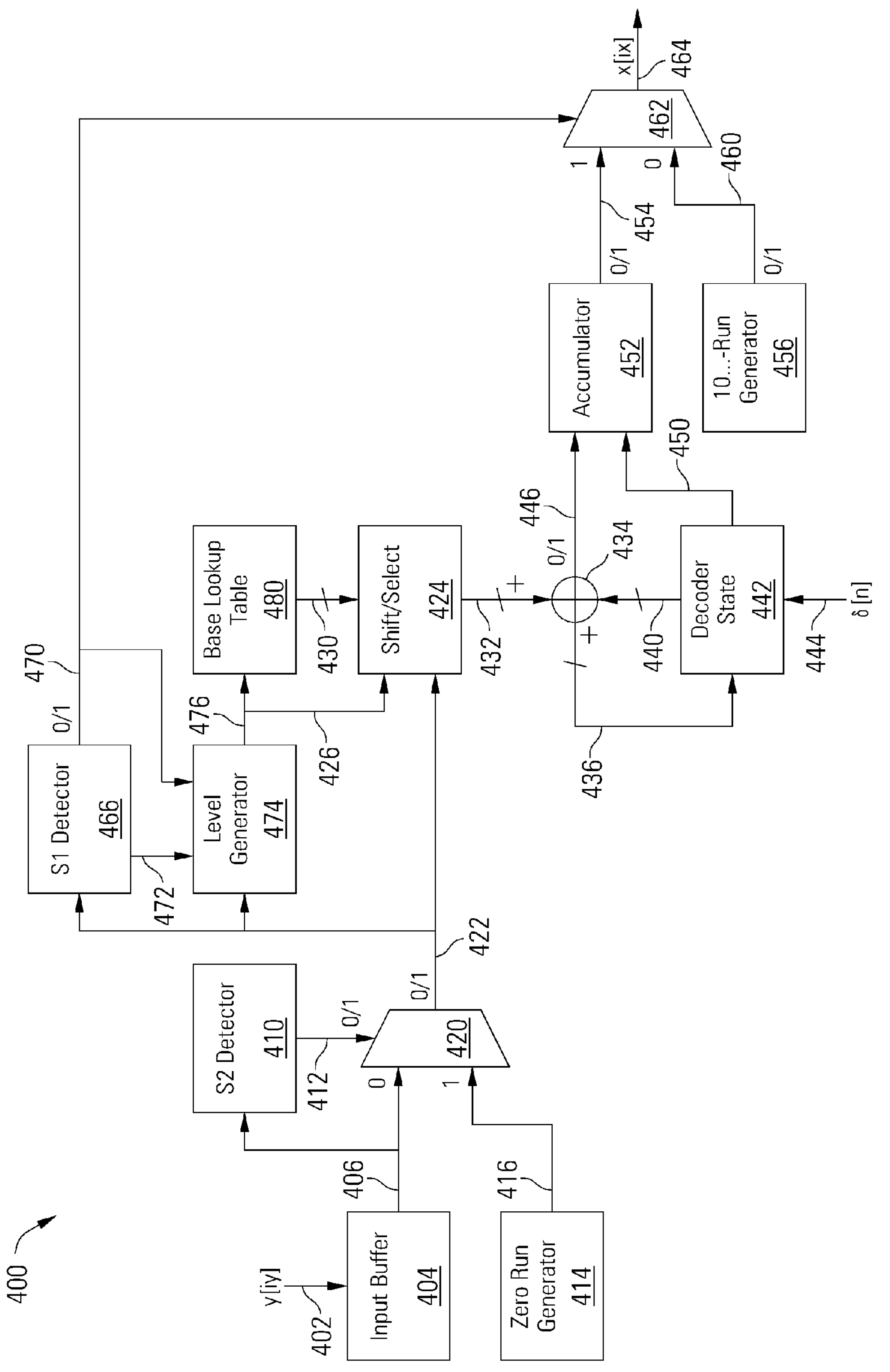
FIG. 4 depicts a block diagram of a multi-level enumerative decoder in accordance with some embodiments of the present invention.

Turning to FIG. 4, a decoder 400 is disclosed, operable to reverse the encoding performed by the multi-level enumerative encoder 300. Encoded bits y[iy] 402 are received and stored in an input buffer 404. A latency cancellation circuit is included in some embodiments, including a first sync pattern detector 466, a "1000 . . . " bit pattern generator 456 and a selection switch or multiplexer 462. A K-constraint circuit is included in some embodiments, including a zero-run generator circuit 414, a second sync pattern detector 410 and a selection switch or multiplexer 420.

The second sync pattern detector 410 detects the fixed second sync pattern in the buffered encoded data 406, yielding an indicator signal 412 that indicates when the fixed second sync pattern was detected in the buffered encoded data 406. A zero-run generator 414 generates a zero-run pattern 416, in some embodiments having a length of 28 bits. The multiplexer 420 replaces the second sync pattern in the buffered encoded data 406 with the zero-run pattern 416, yielding encoded data bits 422.

The first sync pattern detector 466 detects the first sync pattern in the encoded data bits 422, yielding an indicator signal 470 that indicates when the first sync pattern is detected in the encoded data bits 422. The first sync pattern detector 466 also yields the first sync pattern 472 retrieved from the encoded data bits 422. As disclosed above, the first sync pattern 472 also includes the level number.

A level generator 474 retrieves the level number 476 from the first sync pattern 472, using any suitable circuit for selecting the appropriate bits from the first sync pattern 472 depending on the format of the first sync pattern 472 as disclosed above. A base lookup table 430 yields the base 430 based on the level number 476.

A shift/select circuit 424 receives the current input bit of the encoded data bits 422, the base 430, and a shift value 426 that is obtained from the level number 476. In some embodiments, the shift value comprises the four least significant bits of a seven-bit level number 476. The shift/select circuit 424 applies a shift to the base 430, shifting the 11-bit base according to the shift value 426. If the input bit from the encoded data bits 422 is 1, then the shift/select circuit 424 yields as output 432 the base 430, shifted according to the shift value 426. Otherwise, if the input bit from the encoded data bits 422 is 1, the output 432 of the shift/select circuit 424 is 0. Given a 4-bit shift value 426, specifying a shift of between 0 and 7 bits, the shifted 11-bit base in output 432 can be up to 19 bits in some embodiments. In some embodiments, the shift circuit is omitted by storing larger base presentations.

The shifted base in output 432 is added in adder 434 to the decoder state 440 from a decoder state circuit 442, yielding a new 20-bit decoder state 436 which is stored in the decoder state circuit 442. An accumulator 452 accumulates carryovers 446 from the adder 434 (or flips of the decoder state MSB). In some embodiments, the accumulator 452 is a 48 bit accumulator, and the decoder state circuit 442 and accumulator 452 collectively track a 67-bit decoder state. The decoder state 450 is shifted from the decoder state circuit 442 to the accumulator 452 based on the modulation flag $\delta_n$ 444. The accumulator 452 thus accepts shifted bits from the decoder state 450 most significant bit, and outputs the next decoded bits 454.

The "1000 . . . " bit pattern generator 456 yields a prohibited run pattern 460. The multiplexer 462 replaces the decoded bits 454 with the prohibited run pattern 460 whenever the first sync pattern is detected in the corresponding encoded data bits 422 by the first sync pattern detector 466, yielding decoded bits x[ix] 464.

The multi-level enumerative encoder 300 and decoder 400 can be adapted for use with any code rate by adapting the format and contents of the first sync pattern and the bases stored in the base lookup tables 332 and 480.

Figure 5:
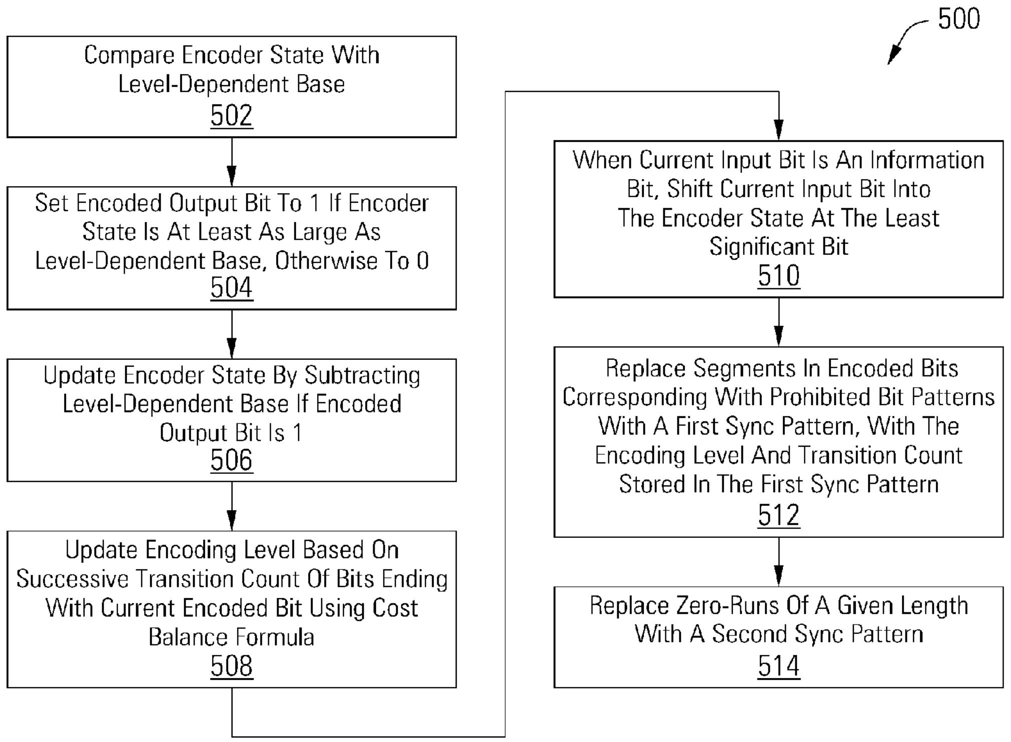
FIG. 5 depicts a flow diagram showing a method for multi-level enumerative encoding in accordance with some embodiments of the present invention.

Turning to FIG. 5, a method for multi-level enumerative encoding is shown in flowchart 500 in accordance with some embodiments of the present invention. Following flowchart 500, the encoder state is compared with the level-dependent base (block 502), and when the encoder state is at least as large as the level-dependent base, the encoded output bit is set to 1 (block 504). The encoder state is updated by subtracting the level-dependent base from the encoder state if the encoded output bit is 1 (block 506). The encoding level is updated based on a transition count using a cost balance formula (block 508). The transition count is a count of consecutive transitions in the encoded bits ending with the current encoded bit. When the current input bit is an information bit (rather than a modulation or parity bit), the current input bit is shifted into the encoder state at the least significant bit of the encoder state (block 510). Segments of the encoded bits corresponding with prohibited bit patterns are replaced with a first sync pattern (block 512). In some embodiments, the first sync pattern stores the encoding level and transition count to be retrieved by the decoder. Zero-runs of a given length are replaced in the encoded bits with a second sync pattern (block 514), satisfying k-constraints.

Figure 6:
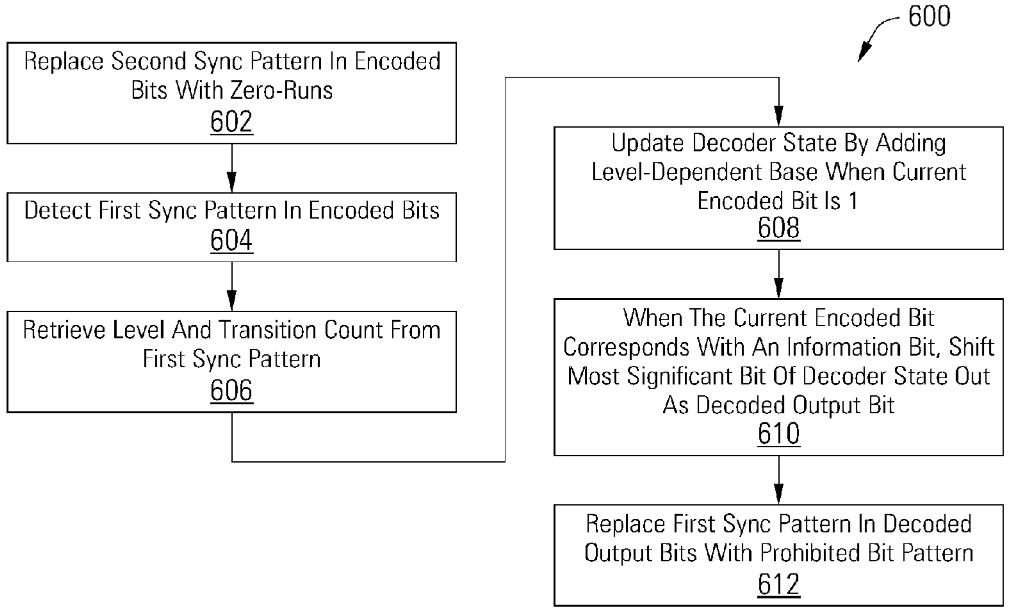
FIG. 6 depicts a flow diagram showing a method for multi-level enumerative decoding in accordance with some embodiments of the present invention.

Turning to FIG. 6, a method for multi-level enumerative decoding is shown in flowchart 600 in accordance with some embodiments of the present invention. Following flowchart 600, the second sync pattern is replaced in the encoded bits with the zero-runs the second sync pattern originally replaced (block 602). The first sync pattern is detected in the encoded bits (block 604), and the level and transition count are retrieved from the first sync pattern (block 606). In some embodiments, the level and transition count are also determined dynamically during decoding. The decoder state is updated by adding the level-dependent base to the decoder state when the current encoded bit has a value of 1 (block 608). When the current encoded bit corresponds with an information bit (in contrast to a modulation or parity bit), the decoder state is shifted with the most significant bit being shifted out as a decoded output bit (block 610). The first sync pattern is replaced in the decoded output bits with the prohibited bit pattern (e.g., 100 . . . 0) the first sync pattern originally replaced (block 612).

Figure 7:
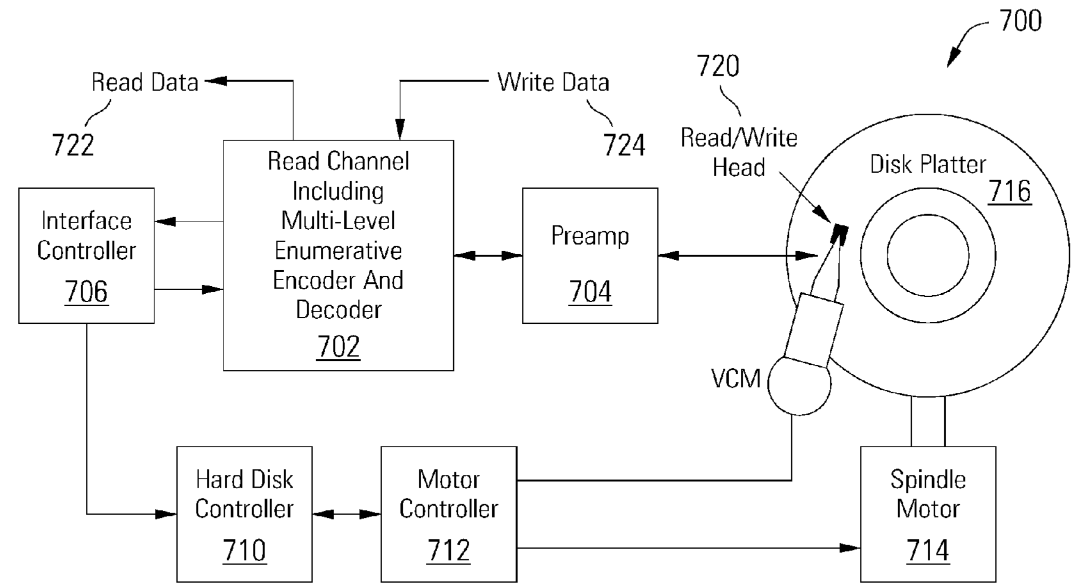
FIG. 7 depicts a storage system including a read channel with a multi-level enumerative encoder and decoder in accordance with some embodiments of the present invention.

Turning to FIG. 7, a storage system 700 is illustrated as an example application of a multi-level enumerative encoder and decoder in accordance with some embodiments of the present invention. The storage system 700 includes a read channel circuit 702 with a multi-level enumerative encoder and decoder in accordance with one or more embodiments of the present invention. Storage system 700 may be, for example, a hard disk drive. Storage system 700 also includes a preamplifier 704, an interface controller 706, a hard disk controller 710, a motor controller 712, a spindle motor 714, a disk platter 716, and a read/write head assembly 720. Interface controller 706 controls addressing and timing of data to/from disk platter 716. The data on disk platter 716 consists of groups of magnetic signals that may be detected by read/write head assembly 720 when the assembly is properly positioned over disk platter 716. In one embodiment, disk platter 716 includes magnetic signals recorded in accordance with either a longitudinal or a perpendicular recording scheme.

In a typical read operation, read/write head assembly 720 is accurately positioned by motor controller 712 over a desired data track on disk platter 716. Motor controller 712 both positions read/write head assembly 720 in relation to disk platter 716 and drives spindle motor 714 by moving read/write head assembly 720 to the proper data track on disk platter 716 under the direction of hard disk controller 710. Spindle motor 714 spins disk platter 716 at a determined spin rate (RPMs). Once read/write head assembly 720 is positioned adjacent the proper data track, magnetic signals representing data on disk platter 716 are sensed by read/write head assembly 720 as disk platter 716 is rotated by spindle motor 714. The sensed magnetic signals are provided as a continuous, minute analog signal representative of the magnetic data on disk platter 716. This minute analog signal is transferred from read/write head assembly 720 to read channel circuit 702 via preamplifier 704. Preamplifier 704 is operable to amplify the minute analog signals accessed from disk platter 716. In turn, read channel circuit 702 digitizes and decodes the received analog signal to recreate the information originally written to disk platter 716. This data is provided as read data 722 to a receiving circuit. While processing the read data, read channel circuit 702 decodes the read data to detect and correct errors, including decoding to reverse previous multi-level enumerative modulation encoding. Such multi-level enumerative decoding can be implemented consistent with the disclosure above in relation to FIGS. 1 and 4. In some embodiments, the multi-level enumerative decoding can be performed consistent with a process disclosed above in relation to FIG. 6. A write operation is substantially the opposite of the preceding read operation with write data 724 being provided to read channel circuit 702. This data is then modulation encoded using multi-level enumerative modulation encoding. The data can be further encoded, for example with low density parity check code encoding, prior to being written to disk platter 716. Such multi-level enumerative encoding can be implemented consistent with the disclosure above in relation to FIGS. 1 and 3. In some embodiments, the multi-level enumerative encoding can be performed consistent with a process disclosed above in relation to FIG. 5.

It should be noted that storage system 700 can be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 700, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 700 can be modified to include solid state memory that is used to store data in addition to the storage offered by disk platter 716. This solid state memory may be used in parallel to disk platter 716 to provide additional storage. In such a case, the solid state memory receives and provides information directly to read channel circuit 702. Alternatively, the solid state memory can be used as a cache where it offers faster access time than that offered by disk platter 716. In such a case, the solid state memory can be disposed between interface controller 706 and read channel circuit 702 where it operates as a pass through to disk platter 716 when requested data is not available in the solid state memory or when the solid state memory does not have sufficient storage to hold a newly written data set. Based upon the disclosure provided herein, one of ordinary skill in the art will recognize a variety of storage systems including both disk platter 716 and a solid state memory.

Figure 8:
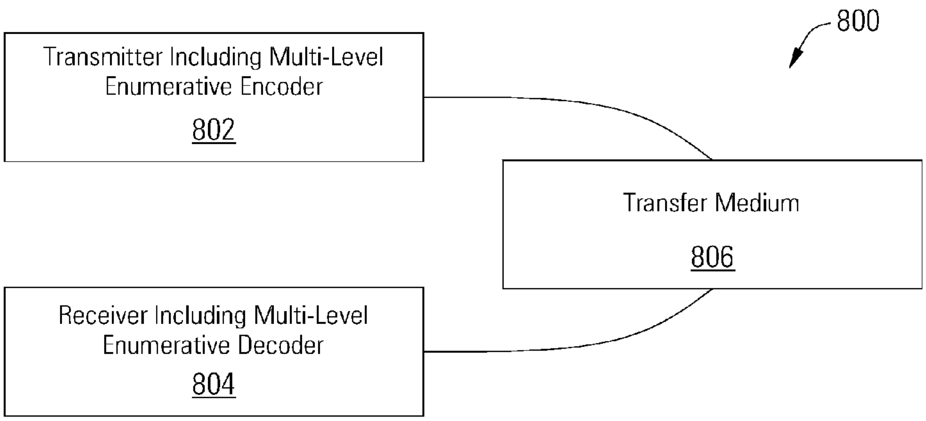
FIG. 8 depicts a wireless communication system including a multi-level enumerative encoder and decoder in accordance with some embodiments of the present invention.

Turning to FIG. 8, a wireless communication system 800 or data transmission device including a transmitter 802 and receiver 804 with a multi-level enumerative encoder and decoder is shown in accordance with some embodiments of the present invention. The transmitter 802 is operable to perform modulation encoding of data using multi-level enumerative encoding to approach the Markov source characteristics of the wireless channel or transfer medium 806. Such multi-level enumerative decoding can be implemented consistent with the disclosure above in relation to FIGS. 1 and 3. In some embodiments, the multi-level enumerative decoding can be performed consistent with a process disclosed above in relation to FIG. 5. In some cases, the data is further encoding to provide error correction capability before transmission.

The encoded information is transmitted via a transfer medium 806 as is known in the art. The encoded data is received from transfer medium 806 by receiver 804. Receiver 804 incorporates a multi-level enumerative decoder operable to reverse the modulation encoding performed in transmitter 802. Such multi-level enumerative decoding can be implemented consistent with the disclosure above in relation to FIGS. 1 and 4. In some embodiments, the multi-level enumerative decoding can be performed consistent with a process disclosed above in relation to FIG. 6.

Figure 9:
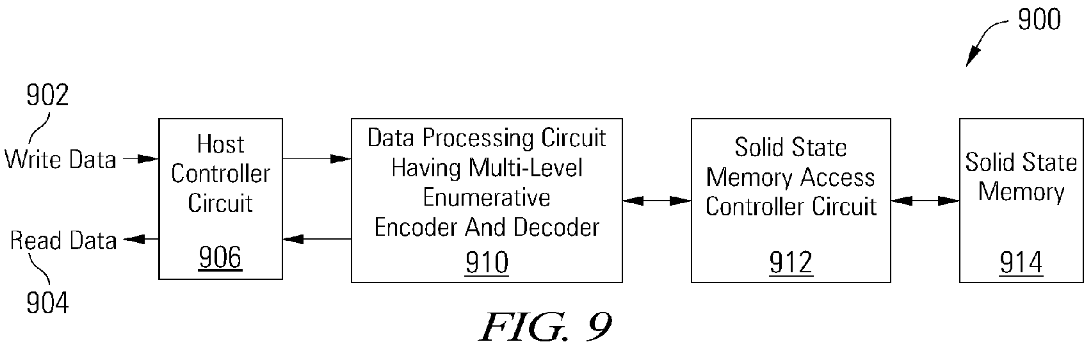
FIG. 9 depicts another storage system including a data processing circuit having a multi-level enumerative encoder and decoder in accordance with some embodiments of the present invention.

Turning to FIG. 9, another storage system 900 is shown that includes a data processing circuit 910 having a multi-level enumerative encoder and decoder in accordance with one or more embodiments of the present invention. A host controller circuit 906 receives data to be stored (i.e., write data 902). This data is provided to data processing circuit 910 where it is encoded using a multi-level enumerative encoder. The encoded data can be further processed or encoded as desired. The encoded data is provided to a solid state memory access controller circuit 912. Solid state memory access controller circuit 912 can be any circuit known in the art that is capable of controlling access to and from a solid state memory. Solid state memory access controller circuit 912 formats the received encoded data for transfer to a solid state memory 914. Solid state memory 914 can be any solid state memory known in the art. In some embodiments of the present invention, solid state memory 914 is a flash memory. Later, when the previously written data is to be accessed from solid state memory 914, solid state memory access controller circuit 912 requests the data from solid state memory 914 and provides the requested data to data processing circuit 910. In turn, data processing circuit 910 decodes the received data using a multi-level enumerative decoder. Such multi-level enumerative encoding and decoding can be implemented consistent with the disclosure above in relation to FIGS. 1-4. In some embodiments, the multi-level enumerative encoding and decoding can be performed consistent with processes disclosed above in relation to FIGS. 5-6. The decoded data and bit error rate are provided to host controller circuit 906 where the data is passed on as read data 904.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for multi-level enumerative encoding and decoding. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. A storage system comprising:
- a storage medium operable to maintain a data set;
- a read/write head assembly operable to write the data set to the storage medium and to read the data set from the storage medium;
- a multi-level enumerative encoder operable to encode the data set before it is written to the storage medium as encoded data, wherein the enumerative encoder applies an enumeration using a plurality of level-dependent bases; and
- a multi-level enumerative decoder operable to decode the data set after it is read from the storage medium.

2. The storage system of claim 1, wherein the multi-level enumerative encoder is operable to determine a level number based at least in part on a cost-balance equation.

3. The storage system of claim 1, wherein the multi-level enumerative encoder is operable to determine a level number based at least in part on a count of successive transitions in the encoded data.

4. The storage system of claim 1, wherein the multi-level enumerative encoder further comprises a latency cancellation circuit, comprising a prohibited pattern detector operable to detect at least one prohibited pattern in the data set and a first sync pattern generator operable to generate a first sync pattern to replace the at least one prohibited pattern in the encoded data corresponding to a segment in the data set containing the prohibited pattern.

5. The storage system of claim 4, wherein the first sync pattern comprises a level number determined by the multi-level enumerative encoder.

6. The storage system of claim 4, wherein the first sync pattern comprises a count of successive transitions in the encoded data.

7. The storage system of claim 1, wherein the multi-level enumerative encoder further comprises a k-constraint circuit, comprising a zero-run detector operable to detect runs of zero's in the encoded data and a second sync pattern generator operable to generate a second sync pattern to replace the runs of zero's in the encoded data.

8. The storage system of claim 1, wherein the bases in the multi-level enumerative encoder comprise floating point representations with periodic mantissas.

9. The storage system of claim 8, wherein the multi-level enumerative encoder applies level-dependent scaling to the bases.

10. The storage system of claim 1, wherein the multi-level enumerative encoder and the multi-level enumerative decoder are operable to encode and to decode in a same bit-significance direction.

11. The storage system of claim 1, wherein the multi-level enumerative encoder is operable to apply an extended maximum transition run constraint to the encoded data limiting a length of successive runs of transitions.

12. The storage system of claim 11, wherein the extended maximum transition run constraint comprises a limit on a number of successive MTR-3 runs of transitions.

13. A multi-level enumerative encoder comprising:
- an encoder state circuit operable to store a state of the multi-level enumerative encoder;
- a base lookup table operable to store a plurality of bases and to yield one of the plurality of bases according to an encoding level in the multi-level enumerative encoder;
- a transition counter operable to generate a count of successive transitions in encoded data from the multi-level enumerative encoder;
- a level generator operable to determine the encoding level in the multi-level enumerative encoder based at least in part on the count of successive transitions; and
- a shift generator operable to shift input bits into the multi-level enumerative encoder based at least in part on the encoding level.

14. The multi-level enumerative encoder of claim 13, wherein the plurality of bases comprise floating point representations with periodic mantissas.

15. The multi-level enumerative encoder of claim 13, wherein the level generator is operable to determine the encoding level in the multi-level enumerative encoder based at least in part on a cost balance of encoded bits.

16. The multi-level enumerative encoder of claim 13, further comprising a latency cancellation circuit, comprising a prohibited pattern detector operable to detect at least one prohibited pattern in the data to be encoded, and a first sync pattern generator operable to generate a first sync pattern to replace the at least one prohibited pattern in the encoded data corresponding to a segment in the data to be encoded that contains the prohibited pattern.

17. The multi-level enumerative encoder of claim 16, wherein the first sync pattern comprises the encoding level.

18. The multi-level enumerative encoder of claim 16, wherein the first sync pattern comprises the count of successive transitions.

19. A multi-level enumerative decoder comprising:

a first sync pattern detector operable to detect a first sync pattern in encoded data;

a level generator operable to determine a decoding level from among a plurality of decoding levels based on the first sync pattern;

a base lookup table operable to store a plurality of bases and to yield one of the plurality of bases according to the decoding level;

a shift circuit operable to shift said one of the plurality of bases based on the decoding level to yield a shifted base; and a decoder state circuit operable to store a decoder state updated based on the shifted base and to shift out decoded bits.

20. The multi-level enumerative decoder of claim 19, further comprising a second sync pattern detector operable to detect a second sync pattern in the encoded data, a zero run generator and a replacement circuit operable to replace the second sync pattern with a zero run in the encoded data.

* * * * *